United States Patent
Han et al.

(10) Patent No.: US 9,412,970 B2
(45) Date of Patent: Aug. 9, 2016

(54) BARRIER FILM COMPOSITE, DISPLAY APPARATUS INCLUDING THE BARRIER FILM COMPOSITE, AND METHOD OF MANUFACTURING DISPLAY APPARATUS INCLUDING THE BARRIER FILM COMPOSITE

(75) Inventors: Dong-Won Han, Yongin (KR); Robert Jan Visser, San Jose, CA (US); Lorenza Moro, San Jose, CA (US)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 382 days.

(21) Appl. No.: 12/981,353

(22) Filed: Dec. 29, 2010

(65) Prior Publication Data
US 2011/0210344 A1    Sep. 1, 2011

Related U.S. Application Data

(60) Provisional application No. 61/291,406, filed on Dec. 31, 2009.

(30) Foreign Application Priority Data

Dec. 6, 2010    (KR) ........................ 10-2010-0123483

(51) Int. Cl.
*H01J 1/62* (2006.01)
*H01L 51/52* (2006.01)

(52) U.S. Cl.
CPC ........ *H01L 51/5256* (2013.01); *H01L 51/5237* (2013.01); *H01L 2251/5338* (2013.01); *Y10T 428/24612* (2015.01)

(58) Field of Classification Search
CPC B29C 61/0616; H05B 33/04; H01L 51/5237; H01L 51/5253; H01L 51/5256
USPC ...................... 257/E51.018, E51.02, E51.022
See application file for complete search history.

(56) References Cited

U.S. PATENT DOCUMENTS

| 4,652,490 A | 3/1987 | Arita et al. |
| 5,260,095 A | 11/1993 | Affinito |
| 5,300,353 A | 4/1994 | Yoshimura et al. |

(Continued)

FOREIGN PATENT DOCUMENTS

| CN | 1627869 A | 6/2005 |
| CN | 1841811 A | 10/2006 |

(Continued)

OTHER PUBLICATIONS

The Extended European Search Report issued by the European Patent Office on Jul. 28, 2011, in the examination of the European Patent Application No. 10252255.4 and Request for Entry attached herewith.

(Continued)

*Primary Examiner* — Ermias Woldegeorgis
(74) *Attorney, Agent, or Firm* — Robert E. Bushnell, Esq.

(57) ABSTRACT

A barrier film composite includes a heat-shrinkable layer having a conformable surface conforming to a surface shape of an object in contact with the heat-shrinkable layer, and a flat surface disposed opposite to the conformable surface; and a barrier layer having a smaller thickness than the heat-shrinkable layer and disposed flat on the flat surface of the heat-shrinkable layer.

5 Claims, 7 Drawing Sheets

(56) References Cited

U.S. PATENT DOCUMENTS

| | | | |
|---|---|---|---|
| 5,395,644 A | 3/1995 | Affinito | |
| 5,440,446 A | 8/1995 | Shaw et al. | |
| 5,547,508 A | 8/1996 | Affinito | |
| 5,691,615 A | 11/1997 | Kato et al. | |
| 5,725,909 A | 3/1998 | Shaw et al. | |
| 5,902,641 A | 5/1999 | Affinito et al. | |
| 6,198,217 B1 * | 3/2001 | Suzuki | H01L 51/5237 313/504 |
| 6,268,695 B1 | 7/2001 | Affinito | |
| 6,413,645 B1 * | 7/2002 | Graff | B32B 27/00 426/126 |
| 6,522,067 B1 | 2/2003 | Graff et al. | |
| 6,570,325 B2 | 5/2003 | Graff et al. | |
| 6,866,901 B2 | 3/2005 | Burrows et al. | |
| 7,198,832 B2 | 4/2007 | Burrows et al. | |
| 7,560,747 B2 | 7/2009 | Cok | |
| 2002/0125822 A1 * | 9/2002 | Graff | H01L 51/5256 313/506 |
| 2003/0164674 A1 | 9/2003 | Imamura | |
| 2004/0031977 A1 * | 2/2004 | Brown | H01L 51/5237 257/222 |
| 2004/0119068 A1 | 6/2004 | Weaver | |
| 2005/0051763 A1 | 3/2005 | Affinito et al. | |
| 2005/0062052 A1 | 3/2005 | Yang et al. | |
| 2005/0127829 A1 | 6/2005 | Takahashi | |
| 2005/0176181 A1 | 8/2005 | Burrows et al. | |
| 2005/0224935 A1 | 10/2005 | Schaepkens et al. | |
| 2006/0159938 A1 | 7/2006 | Lee et al. | |
| 2006/0220548 A1 * | 10/2006 | Menda | H01L 51/5237 313/512 |
| 2006/0270305 A1 | 11/2006 | Imamura | |
| 2007/0164376 A1 | 7/2007 | Burrows et al. | |
| 2007/0196682 A1 | 8/2007 | Visser et al. | |
| 2007/0210459 A1 | 9/2007 | Burrows et al. | |
| 2007/0273972 A1 | 11/2007 | Okayasu | |
| 2007/0281174 A1 | 12/2007 | Moro et al. | |
| 2008/0176041 A1 | 7/2008 | Sato et al. | |
| 2009/0174924 A1 | 7/2009 | Kubota | |
| 2009/0208754 A1 | 8/2009 | Chu et al. | |
| 2009/0279285 A1 | 11/2009 | Nakayama et al. | |
| 2010/0089636 A1 | 4/2010 | Ramadas et al. | |
| 2010/0270919 A1 | 10/2010 | Hubert et al. | |

FOREIGN PATENT DOCUMENTS

| | | |
|---|---|---|
| EP | 1868256 A2 | 12/2007 |
| JP | 60187544 | 9/1985 |
| JP | 2-192691 A | 7/1990 |
| JP | 2002-240862 | 8/2002 |
| JP | 2005026396 | 1/2005 |
| JP | 2005111702 | 4/2005 |
| JP | 2005251704 | 9/2005 |
| JP | 2006094782 | 4/2006 |
| JP | 2006114438 | 4/2006 |
| JP | 2006127841 | 5/2006 |
| JP | 2006297694 | 11/2006 |
| JP | 2008279597 | 11/2008 |
| JP | 2009193754 | 8/2009 |
| JP | 2009252364 | 10/2009 |
| JP | 2009259788 | 11/2009 |
| JP | 2010-052402 | 3/2010 |
| JP | 2010-253860 A | 11/2010 |
| KR | 1020040015360 | 2/2004 |
| KR | 100576639 B | 5/2006 |
| KR | 1020060084659 | 7/2006 |
| KR | 10-2008-0009297 | 1/2008 |
| KR | 1020100108392 | 10/2010 |
| TW | 200847841 A | 12/2008 |
| TW | 200847841 A1 | 12/2008 |
| TW | 200930137 A | 7/2009 |

OTHER PUBLICATIONS

Extended European Search Report issued by the EPO on Feb. 28, 2013 in the corresponding European Patent Application No. 10252256.2.
The extended European search report issued on Feb. 25, 2013 by EPO in connection with European Patent Application Serial No. 10252257.0, which claims priority from the present application.
Japanese Office Action issued Apr. 10, 2012 in connection with Japanese Patent Application Serial No. 2010-293907, which also claims U.S. Appl. No. 61/291,406 as its priority document, and Request for Entry of the Accompanying Office Action attached herewith.
Korean Office Action issued Aug. 3, 2012 in connection with Korean Patent Application Serial No. 10-2010-0123483 and Request for Entry of the Accompanying Office Action attached herewith.
Japanese Office Action dated Sep. 3, 2013 issued by JPO which connection with Japanese Patent Application No. 2010-293239 and also which claims Korean Patent Application No. 10-2010-0123489.
Japanese Patent Office dated Sep. 3, 2013 issued by JPO which connection with Japanese Patent Application No. 2010-293907 and also which claims Korean Patent Application No. 10-2010-0123483 with Request of Entry for Accompanying Office Action.
Taiwanese Office Action issued by the Taiwan Patent Office on Dec. 3, 2013 in connection with Taiwanese Patent Application No. 99146961 which also claims Korean Patent Application No. 10-2010-0123482 as its priority document.
Taiwanese Office Action issued by Taiwan Patent Office on Nov. 25, 2013 in connection with Taiwanese Patent Application No. 91146964 which also claims Korean Patent Application No. 10-2010-0123489 as its prioriry document and priority from the present application.
Taiwanese Office Action issued by the Taiwan Patent Office on Dec. 5, 2013 in connection with Taiwanese Patent Application No. 99146959 which also claims Korean Patent Application No. 10-2010-0123483 as its priority document, and Request for Entry of the Accompanying Office Action attached herewith.
Chinese Registration Determination Certificate issued by Chinese Intellectual Property Office on Apr. 16, 2013 in connection with Chinese Patent Application No. 201010624532.4 which also claims Korean Patent Application No. 10-2010-0123489 as its priority document.
European Office Action issued on Jul. 14, 2014 by EPO in connection with corresponding European Patent Application No. 10252257.0.
European Search Report issued by European Patent Office on Sep. 1, 2015 in connection with European patent application No. 15165523.0.
Dupont, *Kapton Polyimide Film*, web, 2016.

* cited by examiner

BARRIER FILM COMPOSITE, DISPLAY APPARATUS INCLUDING THE BARRIER FILM COMPOSITE, AND METHOD OF MANUFACTURING DISPLAY APPARATUS INCLUDING THE BARRIER FILM COMPOSITE

CLAIM OF PRIORITY

This application makes reference to, incorporates the same herein, and claims all benefits accruing under 35 U.S.C. §119 from a provisional application earlier filed in the U.S. Patent & Trademark Office on 31 Dec. 2009 and there duly assigned Ser. No. 61/291,406, and an application earlier filed in the Korean Intellectual Property Office on 6 Dec. 2010 and there duly assigned Serial No. 10-2010-0123483.

BACKGROUND OF THE INVENTION

1. Field of the Invention

Embodiments of the present invention relate to a barrier film composite, a display apparatus including the barrier film composite, and a method of manufacturing the display apparatus including the barrier film composite.

2. Description of the Related Art

Multilayered thin film barrier composites having alternating layers of barrier material and decoupling material are well known. These barrier composites are typically formed by depositing alternating layers of barrier material and decoupling material, for example, by vapor deposition. Each of the barrier layers is typically a few hundred Angstroms thick, while each of the decoupling layers is generally less than ten microns thick.

There is demand for shrinkable multilayer barrier film composites, methods of forming such shrinkable multilayer barrier film composites, a display apparatus including such a shrinkable multilayer barrier film composite, and a method of manufacturing such a display apparatus.

SUMMARY OF THE INVENTION

Embodiments of the present invention provide a shrinkable barrier film composite, a display apparatus including the shrinkable barrier film composite, and methods of manufacturing the shrinkable barrier film composite and the display apparatus including the shrinkable barrier film composite.

In accordance with an aspect of the present invention, a barrier film composite may include a heat-shrinkable layer having a conformable surface conforming to a surface shape of an object in contact with the heat-shrinkable layer, and a flat surface disposed opposite to the conformable surface; and a barrier layer disposed flat on the flat surface of the heat-shrinkable layer.

A minimum thickness of the heat-shrinkable layer may be larger than a thickness of the barrier layer.

The heat-shrinkable layer may shrink at a predetermined temperature so that the conformable surface thereof conforms to the surface shape of the object and removes an air gap between the object and the heat-shrinkable layer.

A minimum thickness of the heat-shrinkable layer may be larger than a maximum thickness of an air gap between the object and the heat-shrinkable layer.

The heat-shrinkable layer may include an organic polymer.

The barrier layer may include at least one selected from the group consisting of individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof.

The barrier film composite may include a plurality of alternating layers of the heat-shrinkable layer and the barrier layer.

In accordance with another aspect of the present invention, a display apparatus may include a first substrate; a light-emitting device disposed on the first substrate; and a barrier film composite comprising a heat-shrinkable layer having a conformable surface and a flat surface opposite to the conformable surface, and a barrier layer disposed flat on the flat surface of the heat-shrinkable layer, wherein the conformable surface of the heat-shrinkable layer is conformable to a surface shape of the light-emitting device.

A minimum thickness of the heat-shrinkable layer may be larger than a thickness of the barrier layer.

The heat-shrinkable layer may shrink at a predetermined temperature so that the conformable surface thereof conforms to the surface shape of the light-emitting device and removes an air gap between the light-emitting device and the heat-shrinkable layer.

A minimum thickness of the heat-shrinkable layer may be larger than a maximum thickness of an air gap between the light-emitting device and the heat-shrinkable layer.

The barrier film composite may include a plurality of alternating layers of the heat-shrinkable layer and the barrier layer.

The heat-shrinkable layer may pass light generated from the light-emitting device.

An image may be displayed on a surface of the barrier layer.

The light-emitting device may include an organic light-emitting device.

In accordance with another aspect of the present invention, a method of manufacturing a display apparatus, may include steps of providing a barrier film composite comprising a heat-shrinkable layer having a predetermined thickness and a barrier layer that is disposed on a surface of the heat-shrinkable layer; forming a light-emitting device on a substrate; and aligning the barrier film composite to the substrate in a such a manner that the heat-shrinkable layer contacts the light-emitting device and applying heat to the heat-shrinkable layer at a predetermined temperature.

A minimum thickness of the heat-shrinkable layer may be larger than a thickness of the barrier layer.

In the applying of heat to the heat-shrinkable layer, the heat-shrinkable layer may shrink so that a surface thereof contacting the light-emitting device conforms to a surface shape of the light-emitting device and removes an air gap between the light-emitting device and the heat-shrinkable layer.

In the aligning of the barrier film composite to the light-emitting device, a predetermined pressure may be applied thereto.

The barrier film composite may include a plurality of alternating layers of the heat-shrinkable layer and the barrier layer.

In the forming of the light-emitting device, the light-emitting device may include an organic light-emitting device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
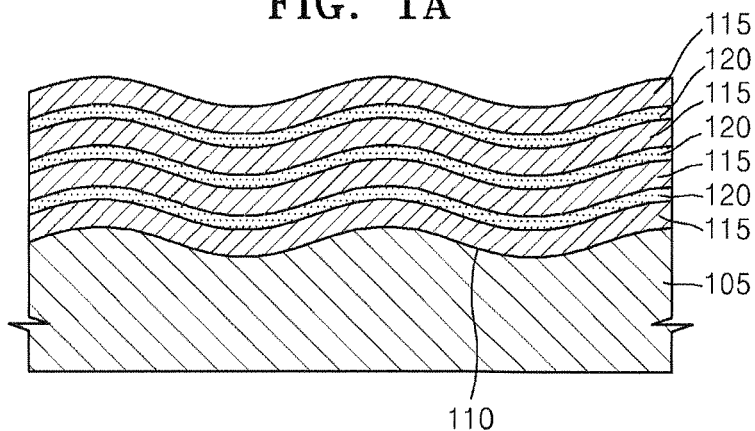
FIGS. 1A to 1C are cross sectional views illustrating a barrier film composite and a method of manufacturing the barrier film composite, according to an embodiment of the present invention.

A film having multilayer barrier coating creates a barrier film with unsurpassed barrier performance, as described in U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; U.S. Pat. No. 6,570,325, entitled "Environmental Barrier Material For Organic Light Emitting Device And Method Of Making", issued May 27, 2003; U.S. Pat. No. 6,866,901, entitled "Method for Edge Sealing Barrier Films", issued Mar. 15, 2005; U.S. Pat. No. 7,198,832, entitled "Method for Edge Sealing Barrier Films", issued Apr. 3, 2007; U.S. patent application Ser. No. 11/068,356, entitled "Method for Edge Sealing Barrier Films", filed Feb. 28, 2005; U.S. patent application Ser. No. 11/693,020, entitled "Method for Edge Sealing Barrier Films", filed Mar. 29, 2007; and U.S. patent application Ser. No. 11/693,022, entitled "Method for Edge Sealing Barrier Films", filed Mar. 29, 2007; U.S. patent application Ser. No. 11/776,616, entitled "Multilayer Barrier Stacks and Methods of Making Multilayer Barrier Stacks," filed Jul. 12, 2007; each of which is incorporated herein by reference.

The number of barrier stacks is not limited. The number of barrier stacks needed depends on the substrate material used and on the level of permeation resistance needed for the particular application. One or two barrier stacks may provide sufficient barrier properties for some applications. The most stringent applications may require five or more barrier stacks.

The barrier stacks may include at least one decoupling layer and at least one barrier layer. There may be one decoupling layer and one barrier layer, there could be at least one decoupling layer disposed on one side of at least one barrier layer, there could be at least one decoupling layer disposed on both sides of at least one barrier layer, or there could be at least one barrier layer disposed on both sides of at least one decoupling layer. A barrier stack may include at least one decoupling layer and at least one barrier layer. The barrier layers in the barrier stacks may be made of the same material or of a different material as each other, and the decoupling layers may also be made of the same material or of a different material as each other.

Each of the barrier layers is typically about 100 to about 2000 Å thick. In some embodiments a first barrier layer which is first formed among all barrier layers may be thicker than later barrier layers which are later formed among all barrier layers in comparison with the first barrier layer, if desired. For example, the first barrier layer may have a thickness of about 1000 Å to about 1500 Å, while later barrier layers may have a thickness of about 400 Å to about 500 Å. In some other embodiments, the first barrier layer may be thinner than later barrier layers. For example, the first barrier layer may have a thickness of about 100 Å to about 400 Å, while later barrier layers may have a thickness of about 400 Å to about 500 Å. The decoupling layers are typically about 0.1 to about 10 μm thick. In some embodiments the first decoupling layer which is first formed among all decoupling layers may be thicker than later decoupling layers, if desired. For example, the first decoupling layer may have a thickness of about 3 μm to about 5 μm, while later decoupling layers which are later formed among all decoupling layers in comparison with the first decoupling layer may have a thickness of about 0.1 μm to about 2 μm.

The barrier stacks may include the same or different layers, and the layers may be arranged in the same or different sequences.

The decoupling layers may be made from the same decoupling material or different decoupling materials. The decoupling layers may be made of at least one selected from among, but not limited to, organic polymers, polymers including inorganic elements, organometallic polymers, hybrid organic/inorganic polymer systems, and combinations thereof. The organic polymers may be at least one selected from among, but not limited to, urethanes, polyamides, polyimides, polybutylenes, isobutylene isoprene, polyolefins, epoxies, parylenes, benzocyclobutadiene, polynorbornenes, polyarylethers, polycarbonates, alkyds, polyaniline, ethylene vinyl acetate, ethylene acrylic acid, and combinations thereof. The polymers including inorganic elements may be at least one selected from among, but not limited to, silicones, polyphosphazenes, polysilazanes, polycarbosilanes, polycarboranes, carborane siloxanes, polysilanes, phosphonitriles, sulfur nitride polymers, siloxanes, and combinations thereof. The organometallic polymers may be at least one selected from among, but not limited to, organometallic polymers of main group metals, transition metals, and lanthanide/actinide metals, and combinations thereof. The hybrid organic/inorganic polymer systems may be at least one selected from among, but not limited to, organically modified silicates, preceramic polymers, polyimide-silica hybrids, (meth)acrylate-silica hybrids, polydimethylsiloxane-silica hybrids, and combinations thereof.

The barrier layers may be made from the same barrier material or different barrier materials. The barrier layers may be made of any suitable barrier material. Suitable inorganic materials based on metals may be at least selected from among, but not limited to, individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof. The metals may be at least one selected from among, not limited to, transition ("d" block) metals, lanthanide ("f" block) metals, aluminum, indium, germanium, tin, antimony and bismuth, and combinations thereof. Many of the resultant metal based materials will be conductors or semiconductors. The fluorides and oxides may be at least one selected from among, but not limited to, dielectrics (insulators), semiconductors and metallic conductors. The conductive oxides may be at least one selected from among, but not limited to, aluminum doped zinc oxide, indium tin oxide (ITO), antimony tin oxide, titanium oxides ($TiO_x$ where $0.8 \leq x \leq 1$), and tungsten oxides ($WO_x$ where $2.7 \leq x < 3.0$). Suitable inorganic materials based on p block semiconductors and non-metals may be at least one selected from among, but not limited to, silicon, silicon compounds, boron, boron compounds, carbon compounds including amorphous carbon and diamond-like carbon, and combinations thereof. The silicon compounds may be at least one selected from among, but not limited to, silicon oxides ($SiO_x$ where $1 \leq x \leq 2$), polysilicic acids, alkali and alkaline earth silicates, aluminosilicates ($Al_xSiO_y$), silicon nitrides ($SN_xH_y$ where $0 \leq y < 1$), silicon oxynitrides ($SiN_xO_yH_z$ where $0 \leq z < 1$), silicon carbides ($SiC_xH_y$ where $0 \leq y < 1$), and silicon aluminum oxynitrides (SiAlONs). The boron compounds may be at least one selected from among, but not limited to, boron carbides, boron nitrides, boron oxynitrides, boron carbonitrides, and combinations thereof.

The barrier layers may be deposited by using any suitable process including, but not limited to, contemporary vacuum processes such as sputtering, evaporation, sublimation, chemical vapor deposition (CVD), plasma enhanced chemical vapor deposition (PECVD), electron cyclotron resonance-plasma enhanced vapor deposition (ECR-PECVD), and combinations thereof.

The decoupling layers may be produced by using a number of known processes which provide improved surface planarity, including both atmospheric processes and vacuum processes. The decoupling layers may be formed by depositing a layer of liquid and subsequently processing the layer of liquid into a solid film. Depositing the decoupling layers as a liquid allows the liquid to flow over and to compensate the defects in the substrate or a previous layer, fill in lower areas, and cover up higher points, providing a surface with significantly improved planarity. When the decoupling layers is processed into a solid film, the improved surface planarity is retained. Suitable processes for depositing a layer of liquid material and processing it into a solid film include, but are not limited to, vacuum processes and atmospheric processes. Suitable vacuum processes include, but are not limited to, those described in U.S. Pat. Nos. 5,260,095, 5,395,644, 5,547,508, 5,691,615, 5,902,641, 5,440,446, and 5,725,909, which are incorporated herein by reference. Liquid spreading apparatuses described in U.S. Pat. Nos. 5,260,095, 5,395,644, and 5,547,508, which are incorporated herein by reference, may be further configured to print liquid monomer in discrete, precisely placed regions of the receiving substrate.

Suitable atmospheric processes include, but are not limited to, spin coating, printing, ink jet printing, and/or spraying. Atmospheric processes refer to processes that run at pressures of about 1 atmosphere and can employ the ambient atmosphere. The use of atmospheric processes presents a number of difficulties including the need to cycle between a vacuum environment for depositing the barrier layer and ambient conditions for the decoupling layer, and exposure of the environmentally sensitive device to environmental contaminants, such as oxygen and moisture. One way to alleviate these problems is to use a specific gas (purge gas) during the atmospheric process to control exposure of the receiving substrate to the environmental contaminants. For example, the process may include cycling between a vacuum environment for barrier layer deposition and an ambient pressure nitrogen environment for the atmospheric process. Printing processes, including ink jet printing, allow the deposition of the decoupling layer in a precise area without the use of masks.

One way to make a decoupling layer involves depositing a polymer precursor, such as a (meth)acrylate containing polymer precursor, and then polymerizing it in situ to form the decoupling layer. As used herein, the term "polymer precursor" means a material which can be polymerized to form a polymer, including, but not limited to, monomers, oligomers, and resins. As another example of a method of making a decoupling layer, a preceramic precursor may be deposited as a liquid by spin coating and then converted to a solid layer. Full thermal conversion is possible for a film of this type directly on a glass or oxide coated substrate. Although the preceramic precursor sometimes cannot be fully converted to a ceramic at temperatures compatible with some flexible substrates, partial conversion to a cross-lined network structure would be satisfactory. Electron beam techniques may be used to crosslink and/or densify some of these types of polymers and may be combined with thermal techniques to overcome some of the substrate thermal limitations, provided the substrate may handle the electron beam exposure. Another example of making a decoupling layer involves depositing a material, such as a polymer precursor, as a liquid at a temperature above its melting point and subsequently freezing it in place.

One method of making a barrier film composite includes providing a substrate, and depositing a barrier layer adjacent to the substrate at a barrier deposition station. The substrate with the barrier layer may be moved to a decoupling material deposition station. A mask is provided with an opening which limits the deposition of the decoupling layer to an area which is smaller than, and contained within, the area covered by the barrier layer. The first layer deposited may be either the barrier layer or the decoupling layer, depending on the design of the composite.

These multilayer, barrier coatings and barrier films are relatively flexible. These multilayer, barrier coatings and barrier films typically start cracking only when they are wrapped over a 7 mm radius spindle. For example, the thin (about 60 nm) aluminum oxide barrier layers in the barrier coating start showing cracks around a 0.75% tensile strain. While optimization of the adhesion and materials might be able to shift the threshold of first cracks to higher values, it is unlikely that such a multilayer barrier film could be stretched to several percent elongation.

The pristine multilayer barrier film has been shown to be almost stress free (the tensile stress of the aluminum oxide layers is only 470 MPa, and the tensile stress of the polymers layers is even lower), resulting in processed films which are flat and which do not curl under heat treatment.

The barrier properties of the pristine multilayer barrier films have been shown to have a water vapor transmission rate (WVTR) of $1 \times 10^{-6}$ g/m$^2$/day.

The application of such stretchable barrier films may be to protect a wide range of environmentally sensitive materials and objects, ranging from flexible displays and solar cells to car bumpers used for corrosion protection and medical applications.

Instead of applying a wet or spray coating to a three dimensional object (paint for instance), more and more industries prefer a moldable coating which can be wrapped on the object (e.g., a car bumper) without the manufacturing company having to conduct wet processing with environmentally unfriendly chemicals and having to deal with the resulting contaminant and waste stream problems.

Another application of stretchable barrier film composites is to be used as a barrier coating on the exterior of a three dimensional object, which may be created by putting a barrier film in a mold and injecting plastic into the mold.

Medical packaging for individual pills pockets using the multilayer barrier film is another potential application of stretchable barrier film composites.

There are a number of ways to realize such structures. These methods make use of the flexibility of the barrier layer or take into account that the barrier layers break on stretching.

The purpose of the invention is either to prevent barrier layers from cracking or to minimize and compensate for cracks. The resulting barrier might not meet a WVTR of $1 \times 10^{-6}$ g/m$^2$/day, but it may still have a good WVTR that is about 100 times better than a homogenous barrier film such as a polychlorotrifluoroethylene film (e.g., ACLAR® film available from Honeywell International, Inc.).

Figure 1B:
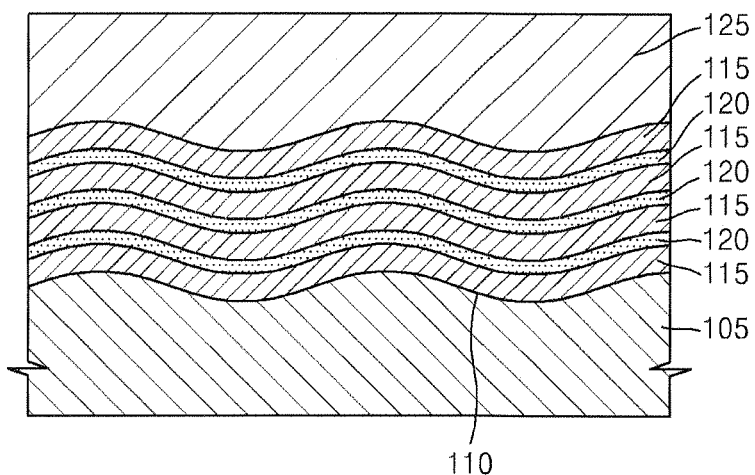
Figure 1C:
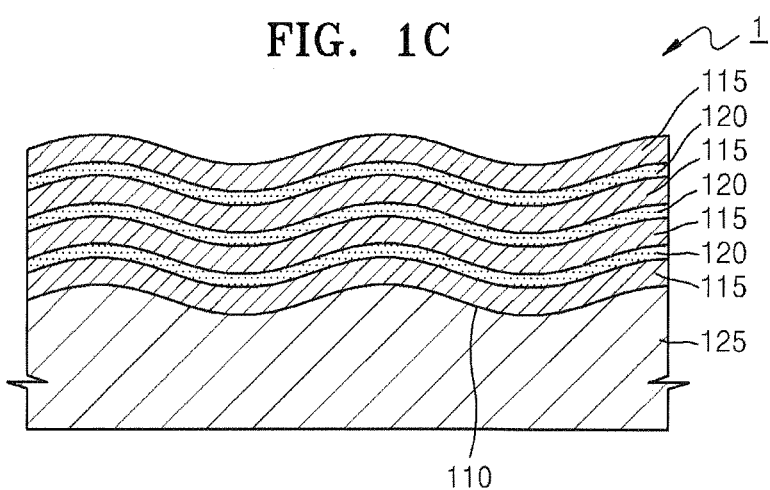

FIGS. 1A to 1C illustrate a barrier film composite 1 and a method of manufacturing the barrier film composite 1, according to an embodiment of the present invention.

Referring FIG. 1A, a mold 105 is provided with an undulating surface. The mold 105 having the undulating surface 110 may be formed by performing embossing or photolithography on an original mold having a flat surface.

Decoupling layers 115 and barrier layers 120 may be alternately formed to conform to the surface of the mold 105. The decoupling layers 115 and the barrier layers 120 form a very soft, elastic undulating structure, which is stretchable. In particular, a decoupling layer 115 is coated on the surface 110 of the mold 105, and a barrier layer 120 is then sputtered over and conforms to the decoupling layer 115. Although FIGS. 1A to 1C illustrate that the decoupling layer 115 is directly disposed on the surface 110 of the mold 105, the deposition order of the decoupling layer 115 and the barrier layer 120 may be reversed. The decoupling layers 115 may include, but are not limited to, cross-linked acrylates with low glass transition temperatures (Tg), for example, ranging from about −80° C. to about 40° C. This process may be repeated as many times as necessary, forming alternating layers of decoupling layers 115 and barrier layers 120 conforming to one another.

Referring to FIG. 1B, a film 125 may be laminated on a surface of the alternating decoupling layers 115 and barrier layers 120. The film 125 also has an undulating surface due to the undulating structure of the decoupling layers 115 and barrier layers 120. The film 125 may be formed from a stretchable material. Thus, the film 125 has a stretchable structure. The film 125 may include, but is not limited to, at least one selected from among polyethylene, polypropylene, polycarbonate, and combinations thereof.

Referring to FIG. 1C, the mold 105 is released from a barrier film composite 1 that includes the alternating layers of decoupling layers 115 and barrier layers 120, and the film 125. In order to facilitate the release of the mold 105 from the barrier film composite 1, the adhesion between the surface 110 of the mold 105 and the layer in direct contact with the surface 110 may be weaker than the adhesion between the film 125 and the alternating layers of decoupling layers 115 and barrier layers 120.

As a result, the barrier film composite 1, including the alternating layers of decoupling layers 115 and barrier layers 120, released from the mold 105 may provide a very soft, elastic polymer-based structure with an undulating surface. Instead of using wet or spay coating, the undulating structure is created using molding with the mold 105, thereby alleviating environmental problems.

Figure 2:
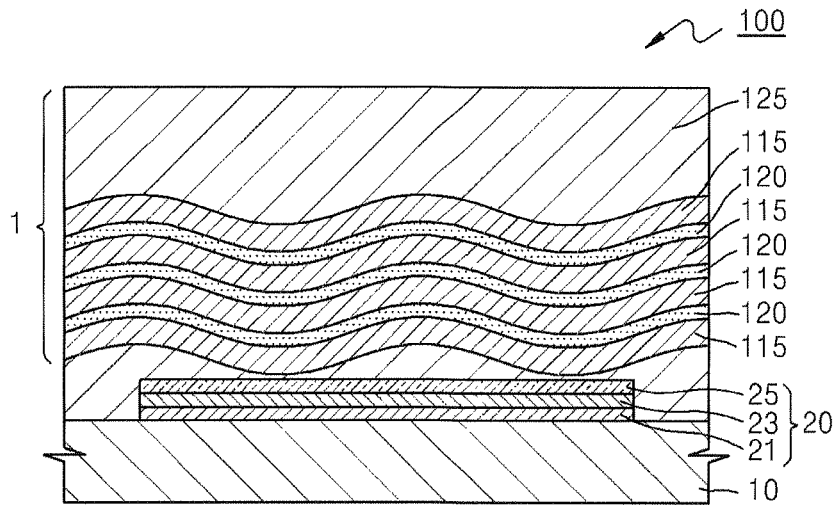
FIG. 2 is a cross sectional view illustrating an organic light-emitting display apparatus including the barrier film composite of FIG. 1C, according to an embodiment of the present invention.

FIG. 2 illustrates an organic light-emitting display apparatus 100 including the barrier film composite 1 of FIG. 1C, according to an embodiment of the present invention.

As described above, the barrier film composite 1 may be used with environmentally sensitive materials or objects, and may be used in a flexible display apparatus. Organic light-emitting display apparatuses include organic emission layers that are vulnerable to oxygen and moisture, and there is also an increasing demand for flexible display apparatuses as next-generation display apparatuses.

Referring to FIG. 2, the organic light-emitting display apparatus 100 includes an organic light-emitting device 20 on a surface of a substrate 10, and the barrier film composite 1, which encapsulates the organic light-emitting device 20. Although FIG. 2 illustrates an exemplary application of the barrier film composite 1 as an encapsulating material for the organic light-emitting device 20, aspects of the present invention are not limited thereto. The barrier film composite 1 may also be used as the substrate 10. When the barrier film composite 1 is used only to encapsulate the organic light-emitting device 20, the substrate 10 may include a flexible material, such as plastics or polyimides.

The organic light-emitting device 20 includes a first electrode layer 21, an organic emission layer 23, and a second electrode layer 25.

The first electrode layer 21 and the second electrode layer 25 may be used as either an anode or a cathode, and may each be used as one of a reflective electrode, a transparent electrode, and a semi-transparent electrode.

The organic emission layer 23 may include a low-molecular weight organic material or a large-molecular weight organic material. When the organic emission layer 23 includes a low-molecular weight organic material, a hole transport layer (HTL) and a hole injection layer (HIL) may be sequentially disposed on a surface of the organic emission layer 23, and an electron transport layer (ETL) and an electron injection layer (EIL) may be sequentially disposed on the opposite surface thereof. Other various kinds of layers may be further laminated, if needed. Examples of suitable low-molecular weight organic materials include copper phthalocyanine (CuPc), N'-di(naphthalene-1-yl)-N, N'-diphenyl-benzidine (NPB), tris-8-hydroxyquinoline aluminum (Alq3), and the like. When the organic emission layer 23 includes a large-molecular weight material, a HTL may be further included, in addition to the organic emission layer 23. The HTL may be formed from poly-(2,4)-ethylene-dihydroxy thiophene (PEDOT), polyaniline (PANI), or the like. Examples of suitable large-molecular weight organic materials include polyphenylenevinylenes (PPV), polyfluorenes, and the like.

The organic light-emitting display device 100 including the barrier film composite 1 as described above may have a soft, elastic structure, enabling the manufacture of a flexible display. The barrier film composite 1 does not crack or is less likely to crack, and thus may protect the organic emission layer 23 from external moisture and oxygen.

Although the current embodiment has been described focusing on an organic light-emitting display apparatus, aspects of the present invention are not limited thereto. That is, the barrier film composite 1 may be used in various types of display apparatuses.

Figure 3A:
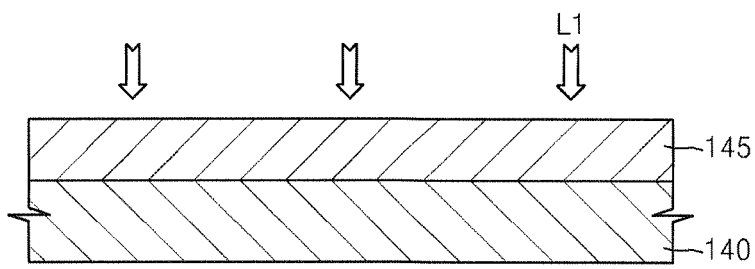
FIGS. 3A to 3C are cross sectional views illustrating a barrier film composite and a method of manufacturing the barrier film composite, according to another embodiment of the present invention.
Figure 3B:
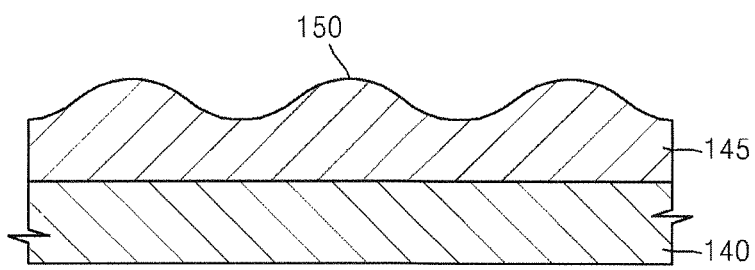
Figure 3C:
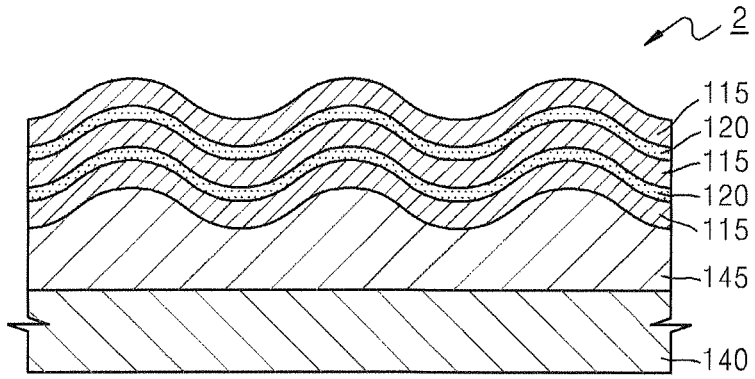

FIGS. 3A to 3C illustrate a barrier film composite 2 and a method of manufacturing the barrier film composite 2, according to another embodiment of the present invention.

Referring to FIG. 3A, a second layer 145 is formed on a first layer 140, and parts thereof are subjected to first irradiation (L1). The first layer 140 may include a flexible material, such as plastic. The second layer 145 may include a flexible monomer. The first irradiation L1 may be laser writing, or irradiation through a mask.

Referring to FIG. 3B, as a result of the first irradiation (L1), the second layer 145 has an undulating surface 150. One surface of the second layer 145 exposed to the first irradiation (L1) partially shrinks or expands resulting in an undulating surface, and the one surface of the second layer 145 is then fixed and firmed and consolidated by a second irradiation (not shown), resulting in the undulating surface 150.

Referring to FIG. 3C, alternating layers of decoupling layers 115 and barrier layers 120 are laminated on the undulating surface 150 of the second layer 145, as in the previous embodiment described above. The undulating surface 150 of the second layer 145 is transferred to the alternating layers of decoupling layers 115 and barrier layers 120, causing one surface thereof to undulate.

The first layer 140, the second layer 145 disposed on the first layer 140 with the undulating surface 150, and the undulating alternating layers of decoupling layers 115 and the barrier layers 120, as described above, form the barrier film composite 2, which may provide a very soft, elastic polymer-based undulating structure. Instead of using wet or spay coating, the undulating structure is created with light irradiation as described above, thereby alleviating environmental problems.

Figure 4:
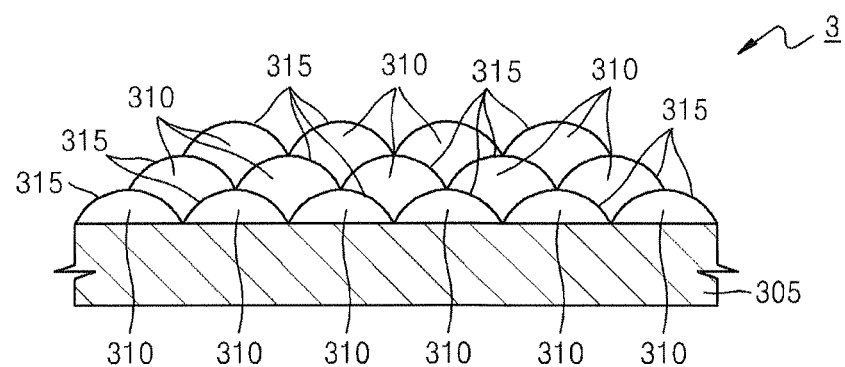
FIG. 4 is a cross sectional view illustrating a barrier film composite according to another embodiment of the present invention.

FIG. 4 illustrates a barrier film composite 3 according to another embodiment of the present invention.

A method of manufacturing a three-dimensional barrier, as described in U.S. application Ser. No. 11/627,583, filed Jan. 26, 2007 entitled "Three Dimensional Multilayer Barrier And Method Of Making", which is incorporated herein by reference.

Referring to FIG. 4, bubbles of polymer material 310 are surrounded by barrier material 315. The polymer material 310 is soft and stretchable. When stretched, most of the bubbles will elongate, but not break. While some bubbles may break, this will not provide a direct path to the outside because the break is covered by other bubbles.

Figure 5A:
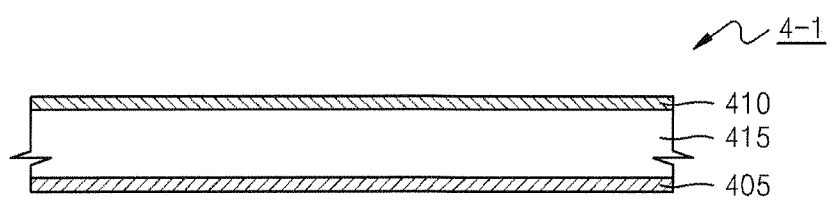
FIGS. 5A and 5B are cross sectional views illustrating barrier film composites according to other embodiments of the present invention.
Figure 5B:
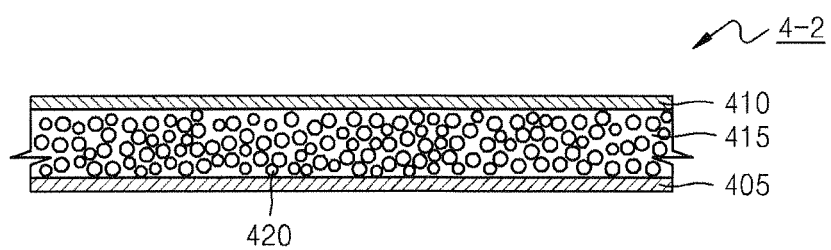

FIGS. 5A and 5B illustrate barrier film composites 4-1 and 4-2, respectively, according to other embodiments of the present invention.

Referring to FIG. 5A, the barrier film composite 4-1 includes double barrier layers 405 and 410. Instead of a single barrier layer in the multiplayer structure, the double barrier layers 405 and 410 are spaced apart from each other by a thin layer (about 10 nm to about 100 nm thick) of rubbery stretchable polymer 415. Suitable rubbery stretchable polymers include, but are not limited to, cross-linked acrylates with low Tg.

Referring to FIG. 5B, the barrier film composite 4-2 may include a getter material 420 dispersing within the polymer layer 415. The particle size (diameter) of the getter material 420 may be on a nanometer scale, for example, may be from about 1 to about 100 nm. Alternatively, the rubbery, stretchable polymer layer 415 may contain inorganic oxide or nitride particles to create a tortuous path for moisture.

Figure 6:
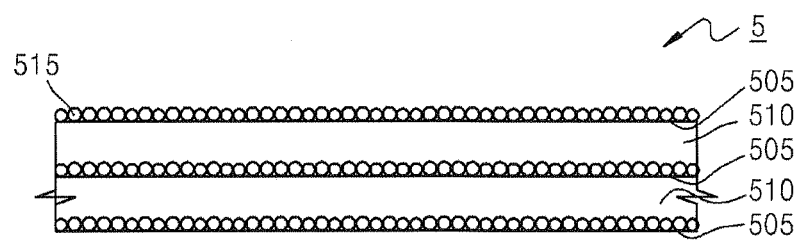
FIG. 6 is a cross sectional view illustrating a barrier film composite according to another embodiment of the present invention.

FIG. 6 illustrates a barrier film composite 5 according to another embodiment of the present invention.

Referring to FIG. 6, the barrier film composite 5 includes alternating layers of inorganic barrier layers 505 and decoupling layers 510. Each of the inorganic barrier layers 505 is covered by a thin layer of getter material 515. When stretched, the inorganic barrier layers 505 may crack, but the getter layer 515 will reduce the impact of the cracks.

Another method of making barrier film composites involves making the inorganic barrier layers out of a very ductile soft metal or metal alloy, such as tin. The multiplayer structure will be semitransparent or even opaque, depending on the thickness and number of layers used. However, there are many applications for the stretchable multilayer barrier which do not require a transparent barrier.

Another method of making barrier film composites is to cover the inorganic barrier layers with a thin layer of nanoparticles of an inorganic oxide or nitride. The inorganic barrier layer may crack when it is stretched, but the nanoparticles should reduce the effect of the cracks by increasing the length of the undulating path.

Figure 7:
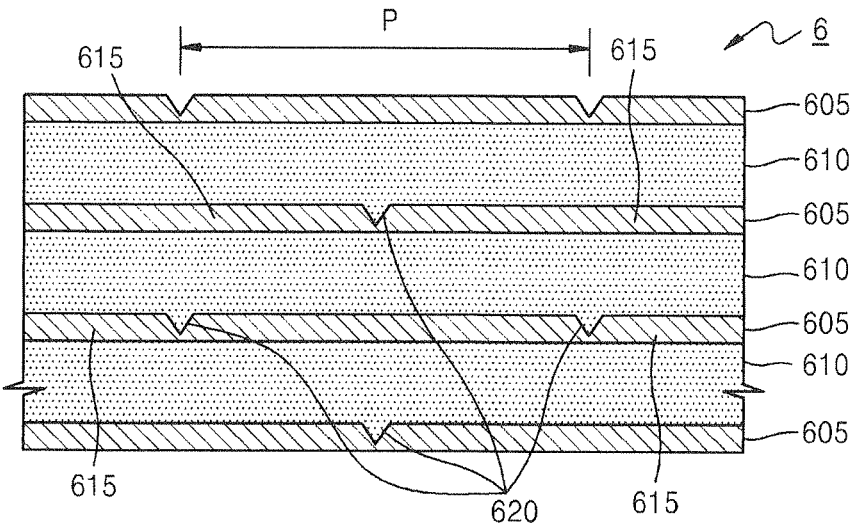
FIG. 7 is a cross sectional view illustrating a barrier film composite according to another embodiment of the present invention.

FIG. 7 illustrates a barrier film composite 6 according to another embodiment of the present invention.

Referring to FIG. 7, the barrier film composite 6 includes alternating layers of barrier layers 605 and decoupling layers 610.

The barrier materials 605 may include inorganic materials, and in some embodiments, may include at least one material selected from among individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof, as listed above.

Each of the barrier layers 605 includes a first region 615, and a second region 620 that is thinner than the first region 615. The second region 620 has less mechanical strength than the first region 615. When the barrier film composite 6 is stretched, the second region 620 alleviates stress and helps the barrier film composite 6 elongate.

The first region 615 and the second region 620 may be formed from the same material. In one embodiment the first region 615 and the second region 620 may be formed from different materials. For example, the second region 620 may include a material having smaller mechanical strength than a material forming the first region 615.

The second region 620 may have varying thicknesses. As illustrated in FIG. 7, the thickness of the second region 620 may decrease toward a center of the second region 620 from sides of the second regions 620 with a wedged cross-section. However, aspects of the present invention are not limited thereto.

Each of the barrier layers 605 may include a plurality of second regions 620. A pitch between each two adjacent second regions 620 may be same. However, aspects of the present invention are not limited thereto. The plurality of second regions 620 may be formed with a shadow mask. However, aspects of the present invention are not limited thereto.

In the barrier film composite 6 with the plurality of barrier layers 605, the second regions 620 in each barrier layer 605 may be positioned so as not to overlap with those in adjacent barrier layers 605.

Thus, even if cracking occurs when the barrier film composite 6 is stretched, the barrier layers 605, including the second regions 620, may reduce the impact of the cracks, since the pitch P between each two adjacent second regions 620 in each barrier layer 605 is also extended, thereby elongating potential external contamination paths, which may be formed by the second regions 620.

Figure 8:
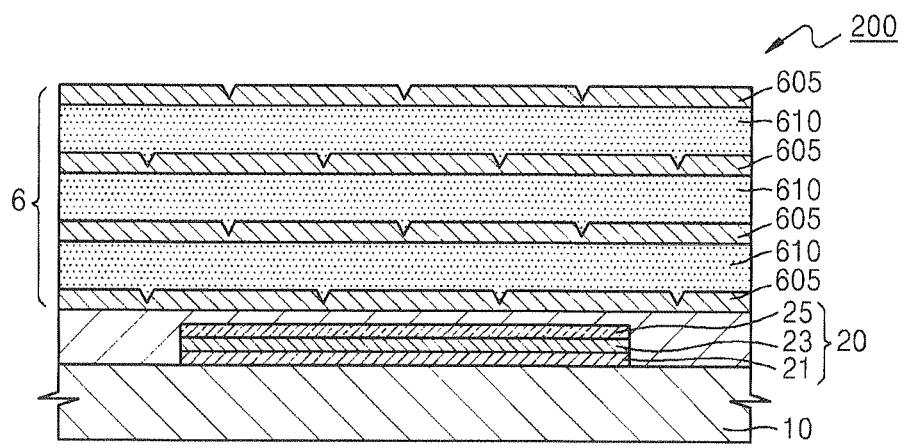
FIG. 8 is a cross sectional view illustrating an organic light-emitting display apparatus including the barrier film composite of FIG. 7, according to an embodiment of the present invention.

FIG. 8 illustrates an organic light-emitting display apparatus 200 including the barrier film composite 6 of FIG. 7, according to another embodiment of the present invention.

Referring to FIG. 8, the organic light-emitting display apparatus 200 includes an organic light-emitting device 20 on a surface of a substrate 10, and the barrier film composite 6, which encapsulates the organic light-emitting device 20. Although FIG. 8 illustrates an exemplary application of the barrier film composite 6 as an encapsulating material for the organic light-emitting device 20, aspects of the present invention are not limited thereto. The barrier film composite 6 may also be used as the substrate 10. When the barrier film composite 6 is used only to encapsulate the organic light-emitting device 20, the substrate 10 may include a flexible material, such as plastics or polyimides.

The organic light-emitting device 20 includes a first electrode layer 21, an organic emission layer 23, and a second electrode layer 25. A detailed description of the organic light-emitting device 20 will not be provided here, since it has already been described above in connection with the organic light-emitting display apparatus 100 of FIG. 2.

The organic light-emitting display device 200 including the barrier film composite 6 as described above may have a soft, elastic structure, enabling the manufacture of a flexible display. The barrier film composite 6 is less likely to crack, and thus may protect the organic emission layer 23 from external moisture and oxygen, even when cracking occurs, due to the pitch P extending between the second regions 620 and potential external contamination paths are elongated as the barrier film composite 6 is stretched.

Figure 9:
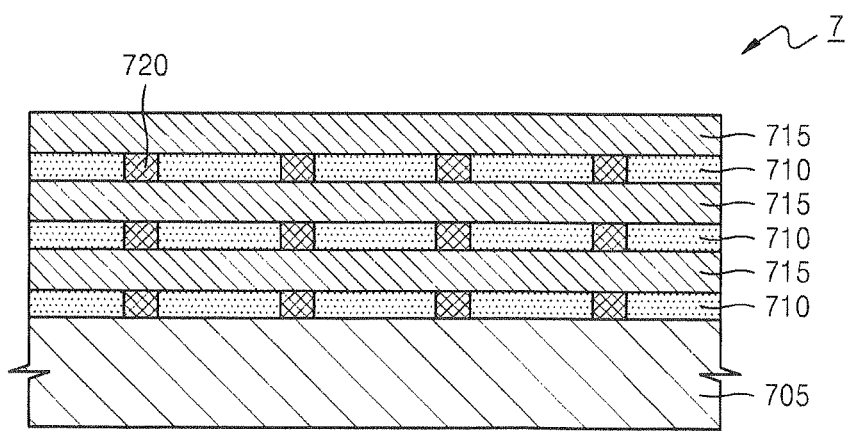
FIG. 9 is a cross sectional view illustrating a barrier film composite according to another embodiment of the present invention.

FIG. 9 illustrates a barrier film composite 7 according to another embodiment of the present invention.

Referring to FIG. 9, the barrier film composite 7 includes alternating layers of inorganic barrier layers 705 and decoupling layers 715 alternatingly disposed on a substrate 705. Metal ribs 720 may be disposed in the inorganic barrier layers 705, if partial loss of transparency is acceptable. Suitable materials for the metal ribs 720 include, but are not limited to, soft metals, alloys, tin (Sn), indium (In), and combinations thereof. The metal ribs 720 can be stretched without breaking. The metal ribs 720 may be two-dimensional.

Figure 10A:
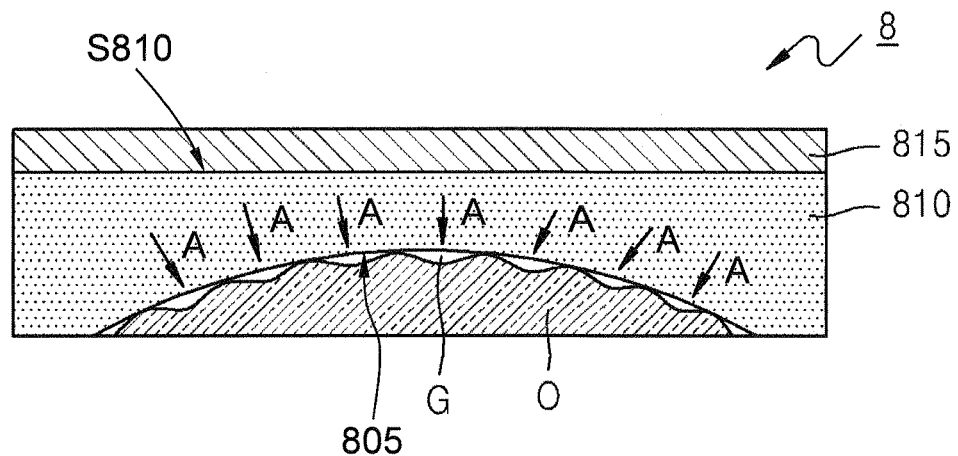
FIGS. 10A and 10B are cross sectional views illustrating a barrier film composite and a method of manufacturing the barrier film composite, according to another embodiment of the present invention.
Figure 10B:
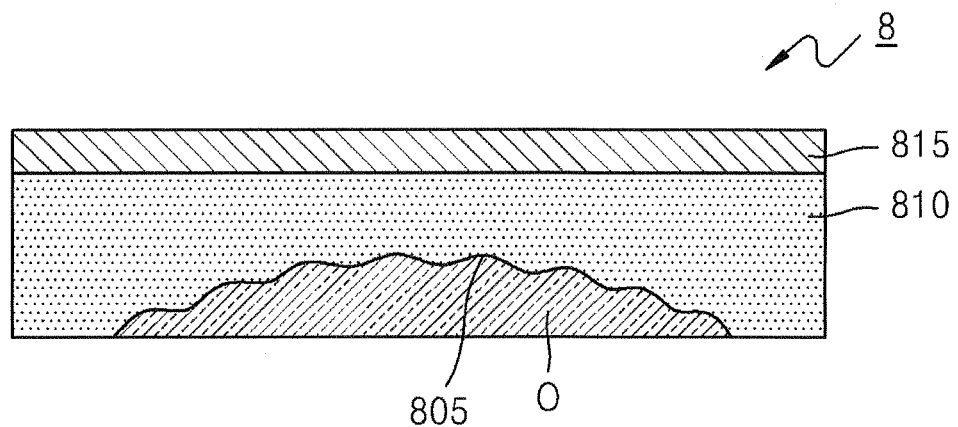

FIGS. 10A and 10B illustrate a barrier film composite 8 and a method of manufacturing the barrier film composite 8, according to another embodiment of the present invention.

Referring to FIGS. 10A and 10B, the barrier film composite 8 may include a heat-shrinkable layer 810 and a barrier layer 815.

The heat-shrinkable layer 810 has a specific thickness. The barrier layer 815 may be formed on a surface S810 of the heat-shrinkable layer 810 and the barrier layer 815 may be flat. The heat-shrinkable layer 810 may be thicker than the barrier layer 815. A minimum thickness of the heat-shrinkable layer 810 may be larger than the thickness of the barrier layer 815. The barrier film composite 8, including the heat-shrinkable layer 810 and the barrier layer 815, may be used to cover an object (O) in such a manner that the heat-shrinkable layer 810 physically contacts the object (O). In one embodiment, the heat-shrinkable layer 810 may be in direct physical contact with the object (O). When the object (O) is covered by the barrier film composite 8, there may be an air gap (G) between the object (O) and the barrier film composite 8. The heat-shrinkable layer 810 may be formed by an organic polymer that is shrinkable at a predetermined temperature.

Referring to FIGS. 10A and 10B, when a predetermined pressure is applied to the barrier film composite 8 at a predetermined temperature, the barrier film composite 8 may be adhered to the object (O) while the heat-shrinkable layer 810 shrinks in directions A, causing the air gap (G) to be pushed out from between the object (O) and the heat-shrinkable layer 810. That is, the heat-shrinkable layer 810 may have the surface 805 that conforms to the surface shape of the object (O) while shrinking. In one embodiment, the entirety of the surface 805 is in immediate physical contact with the surface of the object (O). The surface 805 of the heat-shrinkable layer 810 contacts the object (O). After the surface 805 contacts with the heat-shrinkable layer 810, the surface 805 is limited by the heat-shrinkable layer 810 and is no longer a free surface. Since the heat-shrinkable layer 810 has quite a large thickness, the surface S810 of the heat-shrinkable layer 810 opposite to the surface 805 and the barrier layer 815 thereon may be maintained flat. The minimum thickness of the heat-shrinkable layer 810 may be larger than the maximum thickness of the air gap (G) between the object (O) and heat-shrinkable layer 810.

The heat-shrinkable layer 810 may include an organic polymer that is shrinkable at a predetermined temperature.

The heat shrinkage may occur three-dimensionally, and in some embodiments may occur at least one-dimensionally. For example, the heat shrinkage may occur in the thickness direction of the heat-shrinkable layer 810.

The barrier layer 815 may include at least one selected from the group consisting of individual metals, two or more metals as mixtures, inter-metallics or alloys, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxyborides, metal and mixed metal silicides, and combinations thereof. The heat-shrinkable layer 810 may have the barrier layer 815 on one surface S810 of the heat-shrinkable layer 810, before the heat-shrinkable layer 810 brought into immediate contact with the object (O).

However, aspects of the present invention are not limited thereto. In one embodiment, the barrier layer 815 may be laminated on the heat-shrinkable layer 810 after the heat-shrinkable layer 810 is brought into immediate contact with the object (O). In either one of the above embodiments, the barrier layer 150 may be maintained flat on the heat-shrinkable layer 810.

Figure 11A:
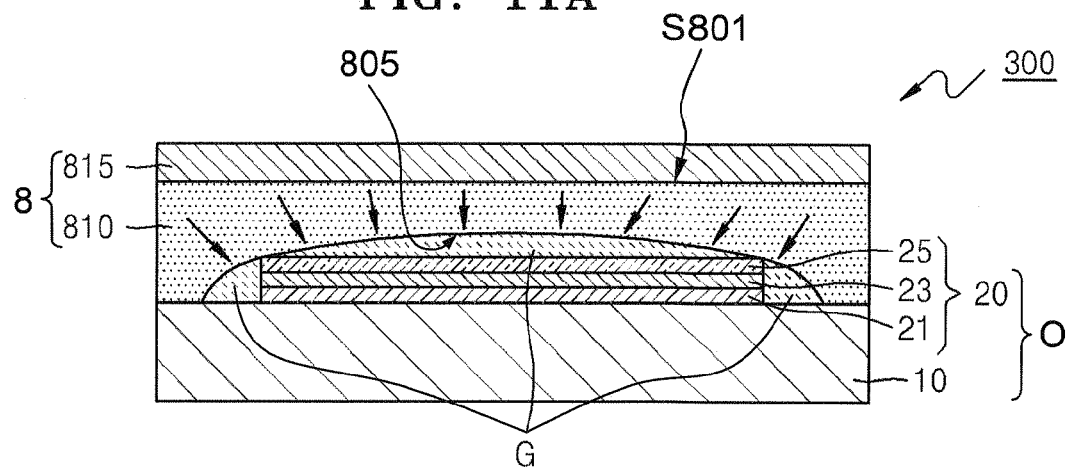
FIGS. 11A and 11B are cross sectional views illustrating an organic light-emitting display apparatus including the barrier film composite of FIGS. 10A and 10B, according to an embodiment of the present invention.
Figure 11B:
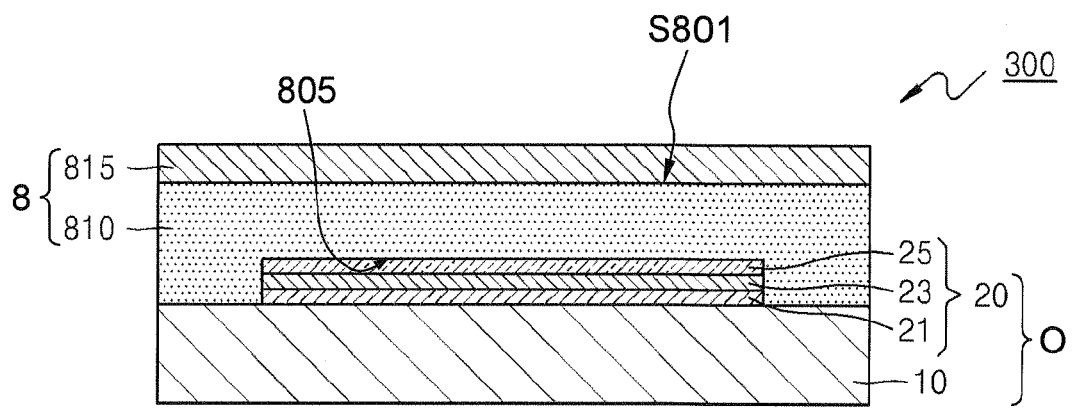

FIGS. 11A and 11B illustrate an organic light-emitting display apparatus 300 including the barrier film composite 8 of FIGS. 10A and 10B in an organic light-emitting device thereof.

Referring to FIGS. 11A and 11B, an organic light-emitting device 20 disposed on a substrate 10 is covered by the barrier film composite 8.

When a predetermined pressure is applied to the barrier film composite 8 at a predetermined temperature, the barrier film composite 8 is adhered to the substrate 10 covering the organic light-emitting device 20, while the heat-shrinkable layer 810 shrinks, causing the air gap (G) to be pushed out from between the object (O) and the heat-shrinkable layer 810. The heat-shrinkable layer 810 becomes to have a surface 805 that conforms to the surface shape of the organic light-emitting device 20 while shrinking. Since the minimum thickness of the heat-shrinkable layer 810 is quite large as compared to the maximum thickness of the air gap (G), an opposite surface S801 of the heat-shrinkable layer 810 away from the organic light-emitting device 20, and the barrier layer 815 thereon may be maintained flat.

The organic light-emitting device 20 includes a first electrode layer 21, a second electrode layer 25, and an organic emission layer 23 between the first electrode layer 21 and the second electrode layer 25. The organic emission layer 23 is vulnerable to moisture and oxygen. Although not illustrated in FIGS. 11A and 11B, organic light-emitting devices, such as the organic light-emitting device 20, normally have an irregular surface, and the heat-shrinkable layer 810 may effectively get rid of the air gap (G), caused by the irregular surface of such an organic light-emitting device, from between the organic light-emitting device 20 and the heat-shrinkable layer 810. As described above, the heat-shrinkable layer 810 may remove the air gap (G) from the contact surface with heat-shrinkable layer 810, thereby ensuring light emitted from the organic light-emitting device 20 to directly pass the heat-shrinkable layer 810 and then the barrier layer 815, not via the air gap (G), and thus, preventing a reduction in light efficiency.

The barrier layer 810 also protects the organic light-emitting device 20, which is vulnerable to moisture and oxygen. In top-emission display apparatuses, since the barrier layer 815 is maintained flat on the heat-shrinkable layer 810, images may be displayed on the barrier layer 815 with reduced distortion. The heat-shrinkable layer 810 and the barrier layer 815 may include a plurality of alternating layers thereof.

Figure 12:
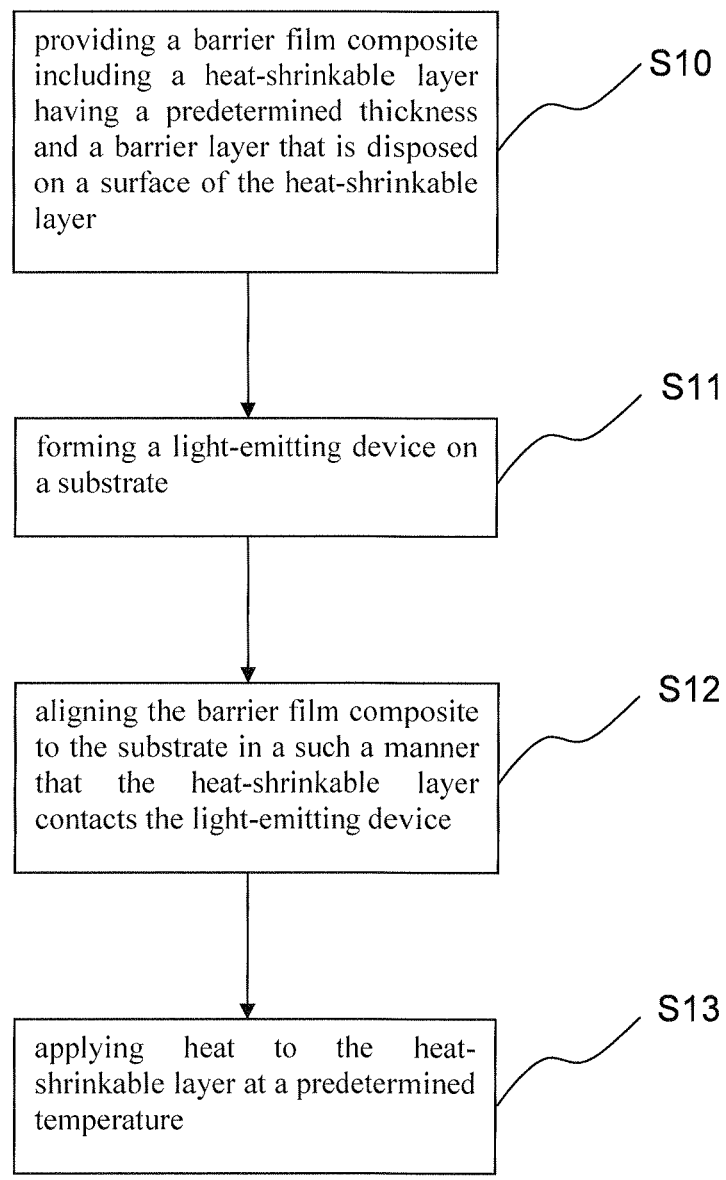
FIG. 12 is a flow chart illustrating a method of manufacturing a display apparatus, according to an embodiment of the present invention.

FIG. 12 is a flow chart illustrating a method of manufacturing a display apparatus. The method includes steps of providing a barrier film composite comprising a heat-shrinkable layer having a predetermined thickness and a barrier layer that is disposed on a surface of the heat-shrinkable layer (S10), forming a light-emitting device on a substrate (S11), aligning the barrier film composite to the substrate in a such a manner that the heat-shrinkable layer contacts the light-emitting device (S12), and applying heat to the heat-shrinkable layer at a predetermined temperature (S13).

Another method involves the use of hexamethyl disiloxane (HMDSO) and oxygen or similar compounds as the inorganic layers in the multilayer barrier stack. The layers may be deposited by using plasma enhanced chemical vapor deposition (PECVD) or by using a spin-on process with optional plasma curing. The elastic properties of these carbon-rich materials are much better than for pure inorganics.

As described above, according to the one or more embodiments of the present invention, a barrier film composite includes a heat-shrinkable layer and a flat layer on the heat-shrinkable layer, wherein the heat-shrinkable layer may be adhered to an object to conform the surface shape of the object. A display apparatus may be manufactured using the barrier film composite.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a display apparatus, the method comprising:
   forming a light-emitting device on a substrate;
   independently from the formation of the light-emitting device, providing a barrier film composite comprising a heat-shrinkable layer having a predetermined thickness and a barrier layer that is disposed on a surface of the heat-shrinkable layer, the heat-shrinkable layer having a conformable surface conforming to a shape of a surface of an object when the surface of the object is in direct physical contact with the heat-shrinkable layer and a flat surface disposed opposite to and spaced apart from the conformable surface, the barrier layer extending throughout an entirety of the flat surface disposed opposite to and spaced apart from the conformable surface; and
   aligning the barrier film composite to the substrate in such a manner that the heat-shrinkable layer contacts the light-emitting device and simultaneously applying pressure and heat to the heat-shrinkable layer to remove an air gap between the light-emitting device and the heat-shrinkable layer,
   wherein a minimum thickness of the heat-shrinkable layer is larger than a thickness of the barrier layer, and the barrier layer is disposed farther from the light-emitting device than the heat-shrinkable layer.

2. The method of claim 1, wherein in the step of applying heat to the heat-shrinkable layer, the heat-shrinkable layer shrinks so that a surface of the heat-shrinkable layer physically contacting the light-emitting device conforms to a surface shape of the light-emitting device and removes an air gap between the light-emitting device and the heat-shrinkable layer.

3. The method of claim 1, wherein in the step of aligning the barrier film composite to the light-emitting device, applying a predetermined pressure to the barrier film composite.

4. The method of claim 1, wherein the barrier film composite comprises a plurality of alternating layers of the heat-shrinkable layer and the barrier layer.

5. The method of claim 1, wherein in the forming of the light-emitting device, the light-emitting device comprises an organic light-emitting device.

* * * * *